United States Patent
Ham et al.

(10) Patent No.: US 7,400,146 B2
(45) Date of Patent: Jul. 15, 2008

(54) MAGNETIC RESONANCE IMAGING APPARATUS WITH REDUCED NOISE PRODUCTION

(75) Inventors: Cornelis Leonardus Gerardus Ham, Eindhoven (NL); Nicolaas Bernardus Roozen, Eindhoven (NL); Patrick Willem Paul Limpens, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 649 days.

(21) Appl. No.: 10/513,526

(22) PCT Filed: May 7, 2003

(86) PCT No.: PCT/IB03/01765

§ 371 (c)(1),
(2), (4) Date: Nov. 4, 2004

(87) PCT Pub. No.: WO03/096043

PCT Pub. Date: Nov. 20, 2003

(65) Prior Publication Data

US 2005/0156595 A1    Jul. 21, 2005

(30) Foreign Application Priority Data

May 8, 2002    (NL)    .................... 02076815

(51) Int. Cl.
*G01V 3/00* (2006.01)
(52) U.S. Cl. ...................................... 324/318; 324/307
(58) Field of Classification Search ......... 324/300–322; 335/316, 299
See application file for complete search history.

(56) References Cited

U.S. PATENT DOCUMENTS

| 4,639,672 | A |   | 1/1987  | Beaumont |
|-----------|---|---|---------|----------|
| 4,876,510 | A | * | 10/1989 | Siebold et al. ............... 324/318 |
| 5,179,338 | A |   | 1/1993  | Laskaris et al. |
| 6,043,653 | A |   | 3/2000  | Takamori et al. |
| 6,147,495 | A | * | 11/2000 | DeMeester et al. .......... 324/320 |
| 6,326,788 | B1 | * | 12/2001 | Mulder et al. ............... 324/318 |
| 6,404,200 | B1 | * | 6/2002  | Dietz et al. .................. 324/318 |

(Continued)

FOREIGN PATENT DOCUMENTS

DE    199 40 550 C1    5/2001

(Continued)

OTHER PUBLICATIONS

Katsunuma, A., et al.; Quiet MRI with Novel Acoustic Noise Reduction; Magnetic Resonance Materials in Physics, Bilogy & Med.; 2002, vol. 13, pp. 139-144.

*Primary Examiner*—Brij B Shrivastav

(57) ABSTRACT

The invention relates to a magnetic resonance imaging (MRI) apparatus comprising a main magnetic system for generating a main magnetic field in an examination volume which is enclosed by the main magnetic system. The MRI apparatus also comprises a magnetic gradient coil system comprising gradient coils. The gradient coil system is accommodated between the main magnetic system and the examination volume in order to generate gradients of the main magnetic field. The MRI apparatus also comprises a vacuum space. According to the invention, the gradient coil system only partly adjoins the vacuum space, that is, by way of its side which faces the vibrations caused by the gradient coil system in operation, while, in a specific embodiment, the end sides of the gradient coil system are available for electrical and mechanical connections outside the vacuum space.

12 Claims, 3 Drawing Sheets

U.S. PATENT DOCUMENTS

Figure 1:
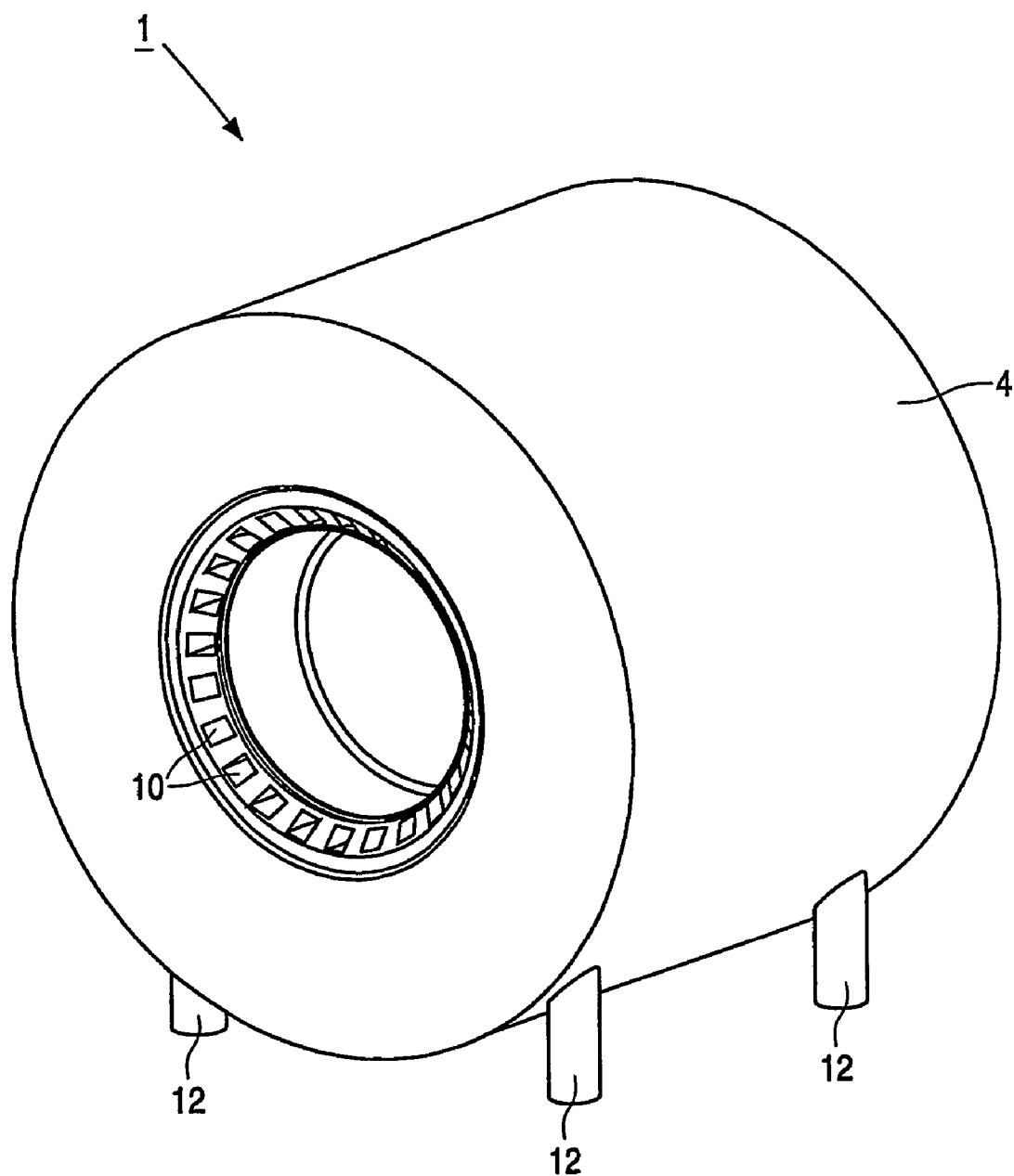

| | | | |
|---|---|---|---|
| 6,501,275 B1 * | 12/2002 | Westphal | 324/319 |
| 6,720,770 B2 * | 4/2004 | Biglieri et al. | 324/322 |
| 7,023,211 B2 * | 4/2006 | Biglieri et al. | 324/322 |
| 7,026,815 B2 * | 4/2006 | Harvey et al. | 324/318 |
| 7,230,427 B2 * | 6/2007 | Kimmlingen et al. | 324/318 |

FOREIGN PATENT DOCUMENTS

| | | |
|---|---|---|
| DE | 100 49 414 C2 | 5/2002 |
| EP | 0 981 057 A2 * | 8/1999 |
| EP | 0 981 057 A2 | 2/2000 |

\* cited by examiner

MAGNETIC RESONANCE IMAGING APPARATUS WITH REDUCED NOISE PRODUCTION

The invention relates to a magnetic resonance imaging apparatus which includes a magnetic main system for generating a magnetic main field in an examination volume space which is situated within the magnetic main system, a magnetic gradient coil system which is provided between the magnetic main system and the examination volume in order to generate at least one gradient of the magnetic main field, and a vacuum space, the gradient coil system only partially adjoining the vacuum space.

A magnetic resonance imaging apparatus of the kind set forth is known from DE-C1-19940550. In this known apparatus a tubular vacuum space is situated between the enclosures of the magnetic gradient coil system and of the magnetic main system, that is at the side of the gradient coil system which is remote from the examination volume. The object is to achieve a reduction of the noise volume which is caused by the operation of the magnetic resonance imaging apparatus. Even though in practice the noise is indeed reduced to some extent, it has been found in particular that the advantageous effect for the patient present in the examination volume remains only limited.

Reference is also made to U.S. Pat. No. 6,043,653. In order to limit annoying noise caused by vibrations of the gradient coil system, the magnetic resonance imaging apparatus described therein is provided with a vacuum chamber which completely encloses the gradient coil system. One cylindrical wall portion of the vacuum chamber extends between the gradient coil system and an RF transmission coil system, while another cylindrical wall portion of the vacuum chamber is formed by the enclosure of the magnetic main system. Even though a construction of this kind indeed yields a reduction of the noise which is larger than that achieved in the magnetic resonance imaging apparatus disclosed in DE-C1-19940550, such a set-up also has drawbacks which are notably of a constructional nature. This also becomes manifest as a high cost price. Because the gradient coil system is situated completely within the vacuum space, it is necessary to use gastight passages through the wall of the vacuum chamber for the leads, such as supply cables and ducts for cooling liquid which are connected to the gradient coil system. The same holds for the feet via which the gradient coil system rests on the base. These feet, evidently engaging the gradient coil system, extend, via a gastight passage, to outside the vacuum chamber. Severe requirements in respect of gastightness are imposed on such passages; in this respect, a complicating factor is formed by the inherent vibrations whereto various parts of the magnetic resonance imaging apparatus are subject. It is also to be noted that small discharge phenomena could occur at the prevailing pressures of from approximately 1 to 10 mbar; such phenomena may notably be due to the supply cable for the gradient coil system and other connections. Discharge phenomena of this kind may have a strong adverse effect on the operation of the relevant magnetic resonance imaging apparatus. In order to avoid such phenomena, it is necessary to take additional constructional steps, for example, in the form of insulation facilities.

In order to generate an as homogeneous as possible magnetic field in the examination volume while keeping the construction as compact as possible, the apparatus which is known from U.S. Pat. No. 6,043,653 utilizes metal rods which are positioned in axially oriented ducts in the wall of the gradient coil system. The magnetic resonance imaging apparatus can thus be tuned to the specific environment in which it is used, that is, in dependence on the characteristics of the environment in which the magnetic resonance imaging apparatus operates, for example, steel reinforcements in a concrete floor on which the magnetic resonance imaging apparatus is erected and possibly also for compensation of manufacturing tolerances. In practice this is realized by positioning metal rods of suitable thickness in a rail system which is made of a non-magnetic material such as stainless steel or aluminum. Such rails are also referred to as "shim rails" and the metal rods as "shim irons". Shim irons of optimum thickness can thus be positioned in the correct positions in the ducts. The process for the adjustment of the magnetic resonance imaging apparatus is considerably hampered by the presence of the vacuum chamber which must be opened for this purpose.

Because the vacuum chamber in the cited U.S. Pat. No. 6,043,653 completely encloses the gradient coil system, the vacuum chamber extends, viewed in the axial direction, beyond the gradient coil system, so that a comparatively long tunnel is formed for the patient. Consequently, a patient positioned in the examination volume will more readily experience claustrophobic sensations. Moreover, the room for movement of the medical staff is also limited, so that it is more difficult or even impossible to carry out medical tasks on a patient in the examination volume.

It is an object of the invention to provide a solution to or at least an improvement for the above drawbacks, whether or not in preferred embodiments of the invention, where notably a substantial noise reduction is achieved for a patient present in the examination volume.

In order to achieve this object, a magnetic resonance imaging apparatus in accordance with the invention is characterized in that the gradient coil system adjoins the vacuum space by way of a side which faces the examination volume. Radiation of sound waves directly from the gradient coil system to the patient is thus prevented, resulting in a substantial reduction of the noise volume experienced by the patient.

A constructionally simple and hence advantageous solution is offered by a special embodiment of a magnetic resonance imaging apparatus in accordance with the invention in which the vacuum space is bounded by a mainly cylindrical wall which is situated between the examination volume and the gradient coil system and forms an integral part of an RF transmission coil system for generating an RF signal in the examination volume. An RF transmission coil system of this kind and its function are known to a person skilled in the art and need not be elucidated herein.

A further embodiment of a magnetic resonance imaging apparatus in accordance with the invention is characterized in that the RF transmission coil system includes an RF transmission coil which is attached to said wall. It is thus achieved that the individual parts can be optimally tuned to their specific function.

Considering the fact that the axial length of the RF transmission coil system usually is shorter than that of the gradient coil system, with a view to further increasing the noise reducing effect it is very advantageous when the wall has an axial length which is greater than an axial length of the RF transmission coil system. It is thus achieved that the part of the gradient coil system which is situated outside the RF transmission coil system is also shielded at least partly.

A very advantageous preferred embodiment is obtained when an RF transmission coil shield which forms part of the RF transmission coil system is situated within the vacuum space. Such an RF transmission coil shield, serving to prevent RF radiation from reaching the gradient coil system, is more effective as the distance between the RF transmission coil shield and the RF transmission coil, also forming part of the RF transmission coil system, is larger. Therefore, the vacuum space constitutes a very attractive position for the RF transmission coil shield. It has been found that the effectiveness of the RF transmission coil shield is not influenced by the fact that the RF transmission coil shield is situated in a space in which a reduced pressure prevails.

A constructionally simple solution is obtained in a further embodiment of a magnetic resonance imaging apparatus in which the vacuum space is sealed by means of sealing means which adjoin the gradient coil system and said wall.

A special embodiment of a magnetic resonance imaging apparatus in accordance with the invention, in which an advantageous compromise is reached between the noise reduction and the constructional complexity of the magnetic resonance imaging apparatus, is characterized in that the gradient coil system adjoins the vacuum space exclusively by way of its side which faces the examination volume.

In order to increase the noise reducing effect further, a further embodiment of the magnetic resonance imaging apparatus in accordance with the invention is provided with a further vacuum space which is situated between the gradient coil system and the main coil system. It is very advantageous if a connection exists between the vacuum space and the further vacuum space, so that these spaces together constitute a common vacuum space. The advantageous effect is due to the fact that means for the common vacuum space have to be provided in singular form only in order to realize the reduced pressure in the common vacuum space. In order to avoid external ducts, it is also advantageous when the connection extends through the gradient coil system.

A special embodiment of a magnetic resonance imaging apparatus in accordance with the invention is characterized in that the gradient coil system comprises two end sides, at least one end side adjoining an atmospheric space. Said at least one end side is excellently suitable for engagement or connection of facilities to the gradient coil system, so that a vacuumtight passage through a wall enclosing the vacuum space can be dispensed with. Said end side does not adjoin the vacuum space, so that at the area of this end side mechanical vibrations of the gradient coil system are converted into sound vibrations. Said end side, however, has a comparatively small surface area, so that said sound vibrations are of limited strength only and hence are not experienced as being annoying.

In a special embodiment of a magnetic resonance imaging apparatus in accordance with the invention an electrical power supply cable for the gradient coil system adjoins said at least one end side of the gradient coil system, so that no vacuumtight passage is required for said electrical power supply cable.

In a further embodiment of a magnetic resonance imaging apparatus in accordance with the invention, the gradient coil system is supported on a base for the magnetic resonance imaging apparatus via the at least one end side of the gradient coil system, so that no vacuumtight passage is required for the structural parts required for such support. Preferably, for the support a constructional connection is provided between the gradient coil system and the magnetic main system, so that supporting is also realized via the magnetic main system. Furthermore, a connection of this kind can provide constructionally simple correct mutual positioning of the magnetic main system and the gradient coil system. In addition, the support can also perform the function of isolating vibrations by utilizing a comparatively flexible connection which is attached to a comparatively rigid area of the magnetic main system. It is advantageous if the magnetic main system comprises an enclosure in the form of a tube whose wall is hollow so as to accommodate a main coil of the main system, said tube having a cylindrical inner wall, a cylindrical outer wall and sealing walls which extend between the ends of the inner wall and the outer wall; the constructional connection therein acts on a sealing wall in the immediate vicinity of the inner wall and/or the outer wall. This location for engagement by the connection offers a high constructional stiffness.

Figure 2:
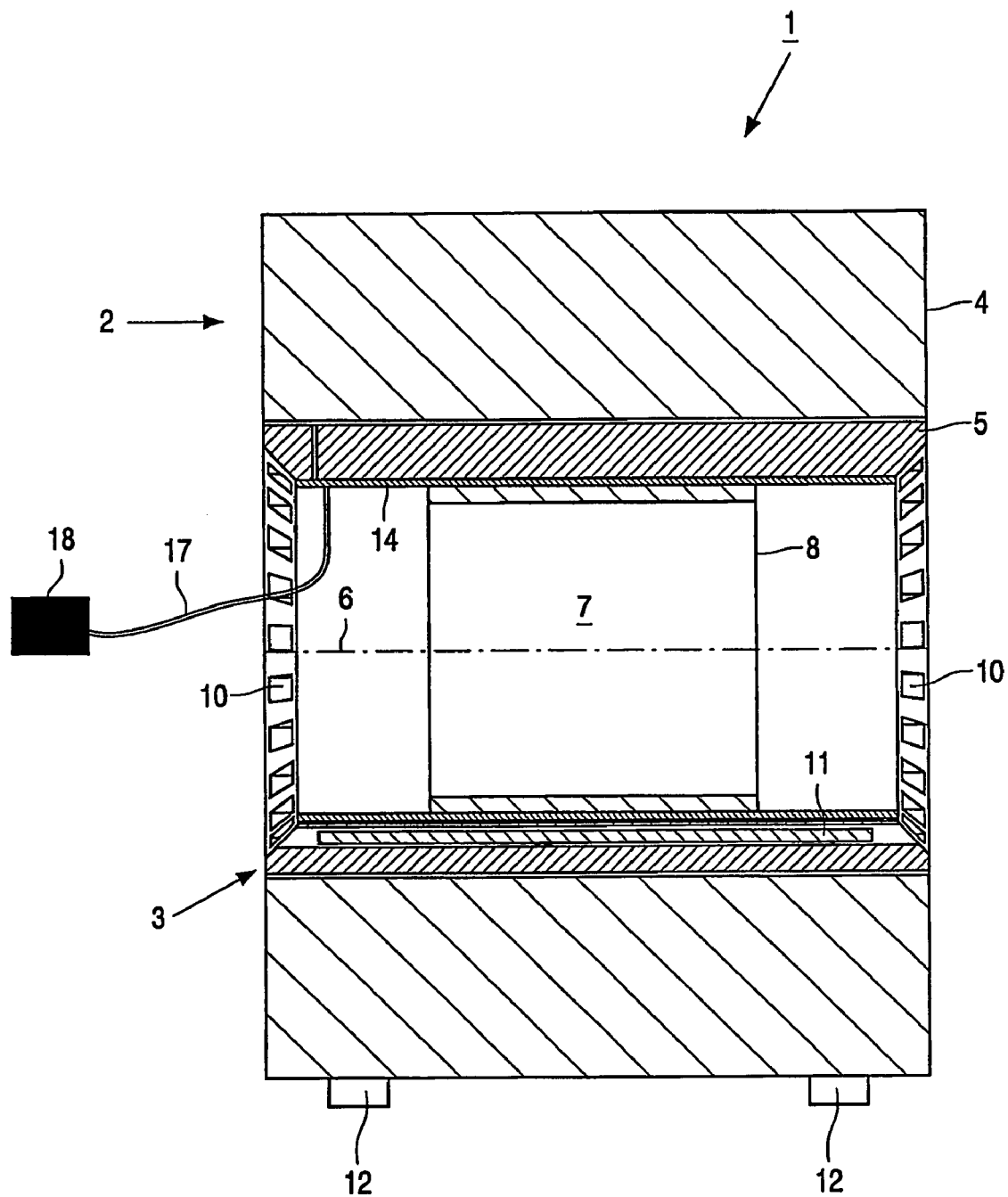
Figure 3:
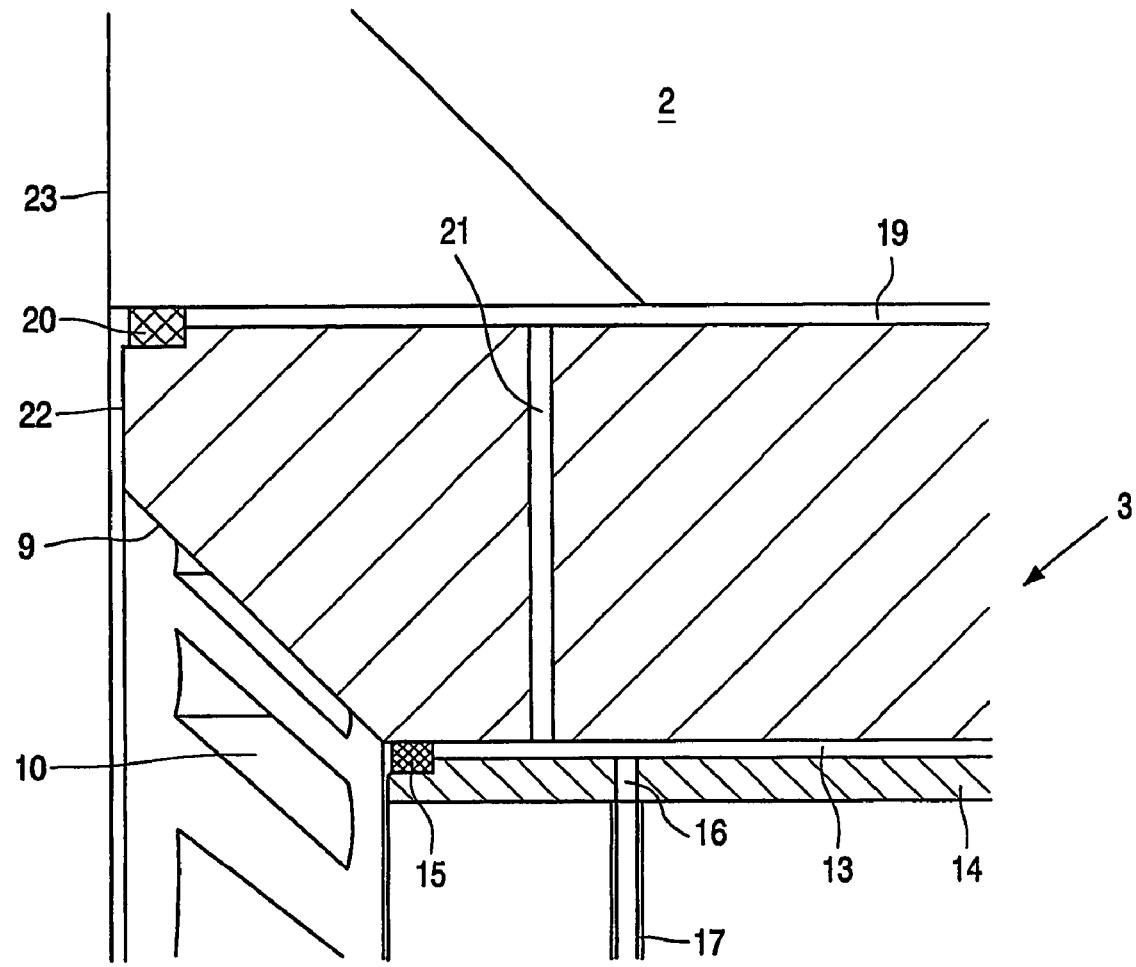

The invention will be described in detail hereinafter with reference to a preferred embodiment of a magnetic resonance imaging apparatus in accordance with the invention. For this description reference is made to the following diagrammatic Figures:

FIG. 1 is a perspective view of a preferred embodiment of a magnetic resonance imaging apparatus in accordance with the invention, FIG. 2 is a longitudinal sectional view of the magnetic resonance imaging apparatus shown in FIG. 1, and FIG. 3 is a sectional view of a detail of the magnetic resonance imaging apparatus shown in FIG. 2.

The magnetic resonance imaging apparatus 1 as shown in FIG. 1 and in FIG. 2 includes a cylindrical magnetic main system 2 which is equipped with magnetic main coils (not shown). A cylindrical gradient coil system 3, which includes magnetic gradient coils (not shown), is arranged inside the magnetic main system 2 so as to be coaxial therewith. The magnetic main system 2 and the gradient coil system 3 with the associated coils, however, may also be constructed so as to have an oval or conical shape without departing from the scope of the invention. A magnetic main system 2 includes an enclosure 4 within which superconducting windings of the magnetic main coils are accommodated and also a cryogenic cooling system for cooling the superconducting windings to the required low temperature and for keeping these windings at that temperature. The gradient coil system 3 also includes an enclosure 5 in which windings of the gradient coils are accommodated.

The magnetic resonance imaging apparatus 1 is provided with an examination volume 7 which is situated around its center line 6 and serves to accommodate a patient. To this end, the patient is slid into the volume 7 while resting on a support. The facilities required for this purpose are not shown in the Figures. Inside the gradient coil system 3 there is situated, that is, at the center when viewed axially, an RF transmission coil system 8 which is coaxial with the gradient coil system 3 and provided with an RF transmission coil (not shown) and an RF transmission coil shield (not shown), the length of which amounts to approximately half of that of the gradient coil system 3.

In the conical side faces 9 to both sides of the gradient coil system 3 there are provided ducts 10 which extend in the axial direction and can receive metal rods (shim plates) 11. The magnetic characteristics of the magnetic resonance imaging apparatus 1 can be tuned to the environment in which the magnetic resonance imaging apparatus 1 operates, and also to the characteristics of the apparatus 1 itself, by suitably choosing the position and the length and the thickness of said plates 11. The magnetic resonance imaging apparatus 1 bears on a base by way of four legs 12 which engage the enclosure 4.

Images of the inside of a patient can be formed by means of the superconducting windings of the magnetic main system 2, the gradient coils of the gradient coil system 3 and the RF transmission coil of the RF transmission coil system 8, that is, under the control of a control system (not shown) which forms part of the magnetic resonance imaging apparatus 1. The electromagnetic forces then occurring give rise to vibrations of the gradient coils of the gradient coil system 3, which vibrations are capable of producing a noise with a high volume which is very annoying to a patient present within the examination volume 7. In order to limit the annoying properties of such a noise, a mainly closed cylindrical space 13 is formed between a tubular sealing member 14 and the gradient coil system 3 on the inside of the gradient coil system 3, as shown in FIG. 3. The sealing member 4 is made of glass epoxy material. On the inside the RF transmission coil of the RF transmission coil system 8 is connected to the sealing member 14 at the center. Alternatively, the RF transmission coil shield of the RF transmission coil system 8 may be situated within the cylindrical volume 13, so that the distance between the RF transmission coil shield and the RF transmission coil is comparatively large; this has a favorable effect on the effectiveness of the RF transmission coil shield.

At the ends of the sealing member 14 flexible rubber sealing rings 15 are provided between the sealing member 14 and the enclosure of the gradient coil system 3. Alternatively, the sealing rings may also be made of, for example, plastic. It is important that the material enables vacuumtight sealing. Moreover, the connection of the sealing rings 15 should not be too stiff. Excessive transfer of mechanical vibrations from the gradient coil system 3 to the sealing member 14 is thus prevented, since otherwise the noise reducing effect pursued by the invention would be canceled again.

The volume 13 is connected to a vacuum pump 18, via a bore 16 in the sealing member 14 and a connecting tube 17, said vacuum pump being capable of reducing the pressure in the volume 13. Consequently, vibrations of the gradient coils of the gradient coil system 3 will produce sound waves to a lesser extent, notably in the examination volume 7.

A further improvement in this respect is achieved in that on the outside of this gradient coil 3 there is also situated a mainly closed cylindrical space 19 in that rubber sealing rings 20 are provided between the axial ends of the enclosures of the gradient coil system 3 and the main coil system 2. Alternatively, such sealing rings may also have a constructional supporting function for the supporting and/or mounting the gradient coil system 3. The space 19 communicates with the space 13 via a radially oriented passage 21 through the gradient coil system 3. The vacuum pump 18 thus also reduces the pressure in the space 19, so that a larger part of the gradient coil system 3 is enclosed by a space with a reduced pressure. Alternatively, it may even be more advantageous to replace the bore 16 by a bore which extends from the end side 22 of the gradient coil system 3 to the space 13 and the space 19, so that more room is now available for the patient in the examination volume 7.

As is clearly shown in FIG. 3 in particular, the enclosure of the gradient coil system 3 may be provided with conical side faces 9 at its end and with radially extending end sides 22. Said side faces 9 and end sides 22 do not adjoin a vacuum space but a normal atmospheric space so that notably the end sides 22 are very well suitable for the couplings and connections required between the gradient coil system 3 and facilities in its vicinity. It has been found that the side faces 9 and the end sides 22 make only a comparatively small, non-annoying contribution to the noise volume experienced in the examination volume 7. In this respect notably electrical power supply cables and ducts for a cooling medium for cooling the gradient coils should be mentioned. Moreover, it may also be very advantageous to connect the enclosures of the gradient coil system 3 and the magnetic main system 2 to one another via constructional connections which engage on the one side the end sides 22 of the gradient coil system 3 and side faces 23 of the magnetic main system 2 on the other side. In order to increase the constructional rigidity, being of importance because of the electromagnetic forces occurring, the points of application are preferably situated near the corner points between the radial faces and the cylindrical faces of the magnetic main system 2 and the gradient coil system 3, because the rigidity is highest at these areas, so that the vibration of the magnetic main system 2 with the associated enclosure 4 will be less.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A magnetic resonance imaging apparatus comprising:
   a magnetic main system that generates a magnetic main field in an examination volume which is situated within the magnetic main system;
   a magnetic gradient coil system which is disposed between the magnetic main system and the examination volume in order to generate at least one gradient of the magnetic main field, the gradient coil system having two end sides, at least one end side adjoining an atmospheric space;
   a vacuum space, the gradient coil system only partially adjoining the vacuum space, the gradient coil system adjoining the vacuum space by way of a side which faces the examination volume; and,
   an electrical power supply cable for the gradient coil system adjoining said at least one end side of the gradient coil system.

2. A magnetic resonance imaging apparatus comprising:
   a magnetic main system that generates a magnetic main field in an examination volume;
   a magnetic gradient coil system disposed between the magnetic main system and the examination volume in order to generate at least one gradient magnetic field, the gradient coil system having two end sides, at least one end side adjoining an atmospheric space, the gradient coil system being supported on a base for the magnetic resonance imaging apparatus via the at least one end side of the gradient coil system;
   a vacuum space, the gradient coil system only partially adjoining the vacuum space.

3. A magnetic resonance imaging apparatus comprising:
   a main magnetic system that generates a main magnetic field in an examination volume;
   a magnetic gradient coil system that generates at least one gradient of the main magnetic field;
   a first vacuum space, disposed between the magnetic gradient system and the examination volume; and,
   a further vacuum space is situated between the gradient coil system and the main coil system.

4. A magnetic resonance imaging apparatus as claimed in claim 3, wherein the vacuum space is bounded by a mainly cylindrical wall which is situated between the examination volume and the gradient coil system and forms an integral part of an RF transmission coil system for generating an RF signal in the examination volume.

5. A magnetic resonance imaging apparatus as claimed in claim 4, wherein the RF transmission coil system includes an RF coil which is attached to said wall.

6. A magnetic resonance imaging apparatus as claimed in claim 4, wherein the wall has an axial length which is greater than an axial length of the RF transmission coil system.

7. A magnetic resonance imaging apparatus as claimed in claim 4, wherein an RF transmission coil shield which forms part of the RF transmission coil system is situated within the vacuum space.

8. A magnetic resonance imaging apparatus as claimed in claim 4, wherein the vacuum space is sealed by means of sealing means which adjoin the gradient coil system and said wall.

9. A magnetic resonance imaging apparatus as claimed in claim 3, wherein the gradient coil system adjoins the vacuum space exclusively by way of its side which faces the examination volume.

10. A magnetic resonance imaging apparatus as claimed in claim 3, wherein the gradient coil system comprises two end sides, at least one end side adjoining an atmospheric space.

11. The magnetic resonance imaging apparatus as set forth in claim 10, further including:
   ducts for receiving shim rods extending into the gradient coil system from at least one of the end sides, the ducts being isolated from the first and further vacuum spaces.

12. The magnetic resonance imaging apparatus as set forth in claim 3, further including:
   a radial passage that connects the first vacuum space and the further vacuum space.

* * * * *